(12) United States Patent
Sugita et al.

(10) Patent No.: US 10,199,251 B2
(45) Date of Patent: Feb. 5, 2019

(54) POSITION DETECTING SYSTEM AND PROCESSING APPARATUS

(71) Applicant: TOKYO ELECTRON LIMITED, Tokyo (JP)

(72) Inventors: Kippei Sugita, Miyagi (JP); Kenji Nagai, Miyagi (JP); Hidetoshi Kimura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/949,205

(22) Filed: Apr. 10, 2018

(65) Prior Publication Data

US 2018/0301322 A1   Oct. 18, 2018

(30) Foreign Application Priority Data

Apr. 12, 2017   (JP) .................................. 2017-079077

(51) Int. Cl.
*H01J 37/32*   (2006.01)
*H01L 21/68*   (2006.01)
(Continued)

(52) U.S. Cl.
CPC .......... *H01L 21/681* (2013.01); *G01B 11/14* (2013.01); *G01B 11/272* (2013.01); *H01J 37/32733* (2013.01); *H01L 21/67259* (2013.01); *H01J 37/3288* (2013.01); *H01J 37/32715* (2013.01); *H01J 2237/204* (2013.01); *H01J 2237/20292* (2013.01)

(58) Field of Classification Search
CPC ..... G01B 11/002; G01B 11/14; G01B 11/272; H01L 21/67259; H01L 21/68; H01L 21/681; H01J 37/32642; H01J 37/32715; H01J 37/32733; H01J 37/3288; H01J 2237/204; H01J 2237/20292
See application file for complete search history.

(56) References Cited

U.S. PATENT DOCUMENTS 5,644,400 A * 7/1997 Mundt .................. G01B 11/08
356/150
6,244,121 B1   6/2001 Hunter
(Continued)

Primary Examiner — Gordon J Stock, Jr.
(74) Attorney, Agent, or Firm — Rothwell, Figg, Ernst & Manbeck, P.C.

(57) ABSTRACT

A position detecting system has a transport device, a light source, at least one optical element, a reflective member, a drive unit, and a controller. The transport device transports and places an object on a placement table. The light source generates measurement light. The optical element projects the measurement light, as projection light, generated by the light source and receives reflected light. The reflective member is disposed on the transport device. The reflective member reflects the projection light toward the placement table, and reflects the reflected light of the projection light, which is projected toward the placement table, toward the optical element. The drive unit operates the transport device so that the reflective member scans a plurality of linear scanning ranges. The controller calculates positional relationship between the focus ring and the object placed on the placement table based on the reflected light within the plurality of linear scanning ranges.

8 Claims, 11 Drawing Sheets

(51) Int. Cl.
*G01B 11/14* (2006.01)
*H01L 21/67* (2006.01)
*G01B 11/27* (2006.01)

(56) References Cited

U.S. PATENT DOCUMENTS

| | | |
|---|---|---|
| 6,468,816 B2 | 10/2002 | Hunter |
| 7,355,715 B2 * | 4/2008 | Suzuki ................. G01J 5/0003 356/478 |
| 8,523,428 B2 * | 9/2013 | Yamawaku ............... G01K 5/48 374/130 |
| 8,730,482 B2 * | 5/2014 | Matsudo ................ G01B 11/06 356/479 |
| 2006/0137988 A1 * | 6/2006 | Yahashi ............ H01J 37/32642 205/82 |
| 2015/0168130 A1 * | 6/2015 | Matsudo ............. H01J 37/3288 156/345.24 |
| 2018/0090354 A1 * | 3/2018 | Sugita ............... H01L 21/67259 |
| 2018/0209780 A1 * | 7/2018 | Schattenburg ....... G01B 11/002 |
| 2018/0261481 A1 * | 9/2018 | Eto ................... H01L 21/67248 |

* cited by examiner

*FIG. 8*

※REFRACTIVE INDEX OF Si

| | INTERFERENCE DISTANCE [mm] | THICKNESS [mm] | | SCANNING DISTANCE [mm] | REMARKS |
|---|---|---|---|---|---|
| | | MEASUREMENT | ASSUMPTION | | |
| A | 12.53 | 3.48 | 3.40 | — | REMAINING FR THICKNESS IS CONFIRMABLE |
| B | 8.94 | 2.48 | 2.50 | 0.85 | W POSITION IS CONFIRMABLE |
| C | 2.77 | 0.77 | 0.78 | — | |

POSITION DETECTING SYSTEM AND PROCESSING APPARATUS

CROSS-REFERENCE TO RELATED APPLICATIONS

This application is based on and claims priority from Japanese Patent Application No. 2017-079077 filed on Apr. 12, 2017, with the Japan Patent Office, the disclosures of which are incorporated herein in their entirety by reference.

TECHNICAL FIELD

The present disclosure relates to a position detecting system and a processing apparatus.

BACKGROUND

A processing apparatus, which performs plasma processing, is used to manufacture an electronic device such as a semiconductor device (see, for example, U.S. Pat. Nos. 6,468,816 and 6,244,121). The processing apparatus disclosed in U.S. Pat. Nos. 6,468,816 and 6,244,121 has a chamber and a placement table. The placement table is provided in the chamber and holds an object placed thereon. In the processing apparatus, the object is transported by a transport device and placed on the placement table, and the object is processed by plasma of a processing gas which is produced in the chamber. A transport device detects a transportation state by transporting a sensor device having the same shape as the object.

SUMMARY

A position detecting system according to one aspect of the present disclosure is a position detecting system used in a processing apparatus. The processing apparatus has a placement table on which a disk-shaped object is placed and a focus ring which is disposed to surround a circumference of the object. The position detecting system includes a transport device, a light source, at least one optical element, a reflective member, a drive unit, and a controller. The transport device transports an object and places the object on the placement table. The light source generates measurement light. The at least one optical element projects the measurement light, as projection light, generated by the light source and receives reflected light. The reflective member is disposed on the transport device. The reflective member reflects the projection light toward the placement table, and reflects the reflected light of the projection light, which is projected toward the placement table, toward the optical element. The drive unit operates the transport device such that the reflective member scans a plurality of linear scanning ranges from the focus ring to the object placed on the placement table. The controller calculates a positional relationship between the focus ring and the object placed on the placement table based on the reflected light within the plurality of linear scanning ranges.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 8 is a table illustrating an example of a part thickness and a scanning distance at each scanning position, that is, a positional relationship between a focus ring and a wafer.

DESCRIPTION OF EMBODIMENT

Figure 1:
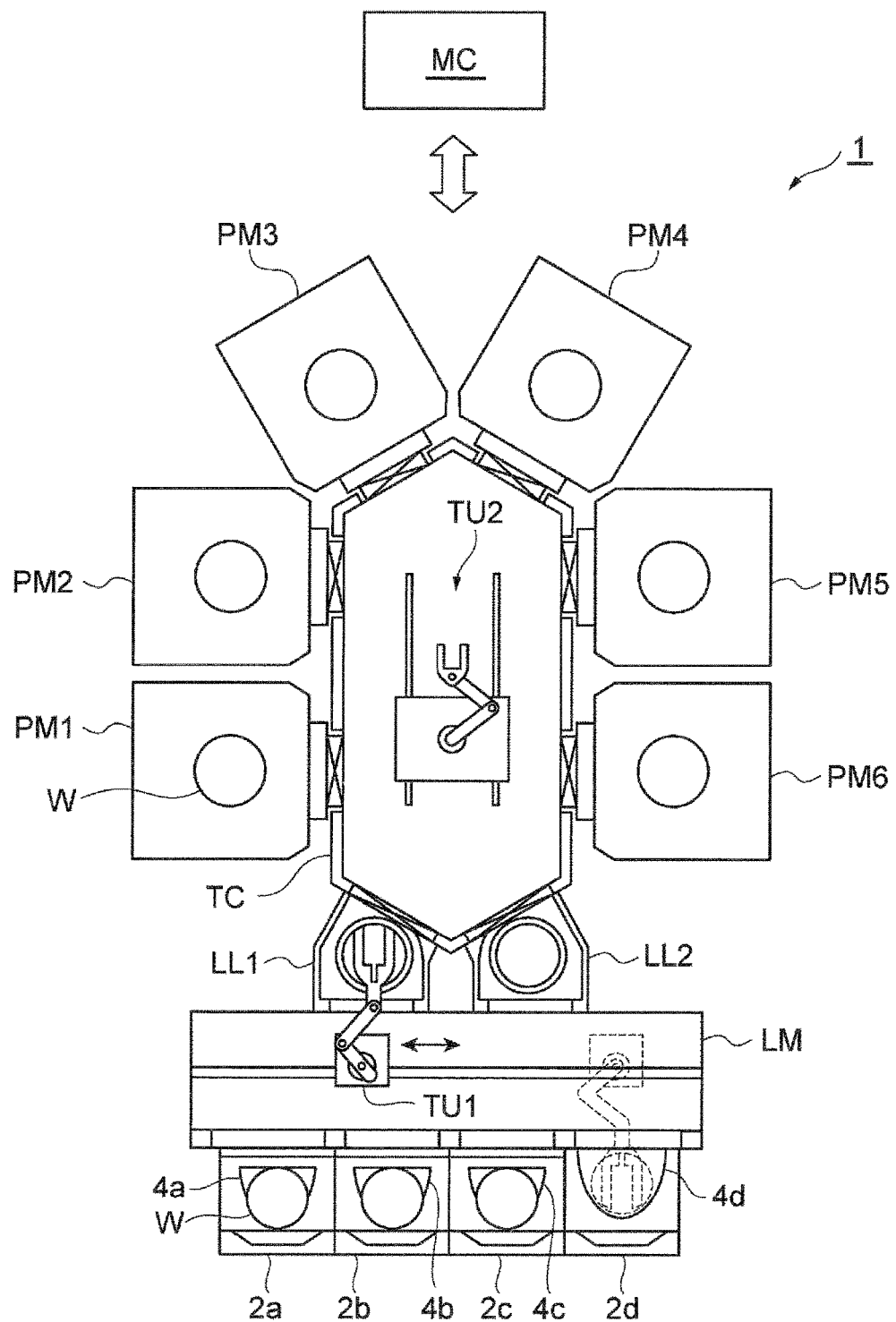
FIG. 1 is a view illustrating an example of a processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a processing apparatus, a focus ring may be provided on the placement table so as to surround a peripheral edge portion of the object. The focus ring is provided to improve in-plane uniformity of the processing on the object. For this reason, the in-plane uniformity of the processing on the object is likely to deteriorate when the object is not accurately disposed with respect to the focus ring. However, in the processing apparatus and the transport device disclosed in U.S. Pat. Nos. 6,468,816 and 6,244,121, a positional relationship between the focus ring and the object may not be determined.

In the technical field, a position detecting system and a processing apparatus which are capable of detecting the positional relationship between the focus ring and the object are required.

A position detecting system according to one aspect of the present disclosure is a position detecting system used in a processing apparatus. The processing apparatus has a placement table on which a disk-shaped object is placed and a focus ring which is disposed to surround a circumference of the object. The position detecting system includes a transport device, a light source, at least one optical element, a reflective member, a drive unit, and a controller. The transport device transports an object and places the object on the placement table. The light source generates measurement light. The at least one optical element projects the measurement light, as projection light, generated by the light source and receives reflected light. The reflective member is disposed on the transport device. The reflective member reflects the projection light toward the placement table, and reflects the reflected light of the projection light, which is projected toward the placement table, toward the optical element. The drive unit operates the transport device such that the reflective member scans a plurality of linear scanning ranges from the focus ring to the object placed on the placement table. The controller calculates a positional relationship between the focus ring and the object placed on the placement table based on the reflected light within the plurality of linear scanning ranges.

In this position detecting system, the measurement light generated by the light source is projected as projection light by the optical element, and the measurement light is reflected by the reflective member and projected toward the placement table. Further, the reflected light of the projection light, which is projected toward the placement table, is reflected toward the optical element by the reflective member. Further, the reflective member scans the plurality of linear scanning ranges, so that the amount of change in thickness of the measurement object in the plurality of scanning ranges is detected. Further, the controller calculates the positional relationship between the focus ring and the object based on the amount of change in thickness of the measurement object within the plurality of scanning ranges. As described above, the position detecting system may grasp the positional relationship between the focus ring and the object placed on the placement table by scanning the reflective member.

In one exemplary embodiment, the controller may determine whether or not the object is disposed at the target position on the placement table based on the positional relationship calculated for each scanning range. The positional relationship between the placement table and the focus ring is fixed. The position detecting system may calculate the positional relationship between the object and the placement table by calculating the positional relationship between the focus ring and the disk-shaped object with respect to at least two points, and may determine whether or not the object is disposed at the target position on the placement table.

In one exemplary embodiment, the transport device may be configured to dispose the reflective member to correspond to the optical element. In this case, the position detecting system may adjust reflection of the reflective member corresponding to each optical element.

In one exemplary embodiment, the processing apparatus may have a chamber main body in which the placement table and the focus ring are disposed, and an upper electrode which is disposed above the focus ring. Further, the light source and the at least one optical element may be disposed at a lateral side outside the chamber main body. In this case, the position detecting system may perform the measurement even though it is difficult to change a configuration of the upper electrode.

In one exemplary embodiment, among the plurality of scanning ranges, two scanning ranges may be positioned on straight lines which are parallel to each other. In one exemplary embodiment, among the plurality of scanning ranges, two scanning ranges may be positioned on a single straight line. In these cases, the position detecting system may detect positional relationship between the object and the part of the processing apparatus such as the placement table or the focus ring based on a geometrical relationship between the two scanning ranges.

In one exemplary embodiment, the controller may calculate, in each of the scanning ranges, a difference between height information of the focus ring obtained based on the reflected light, and reference height information of the focus ring obtained in advance. The position detecting system may grasp the amount of consumption of the focus ring by calculating the aforementioned difference.

A processing apparatus according to another aspect of the present disclosure includes a placement table configured to place a disk-shaped object thereon, a focus ring disposed to surround a circumference of the object, and a position detecting system. The position detecting system includes a transport device, a light source, at least one optical element, a reflective member, a drive unit, and a controller. The transport device transports an object and places the object on the placement table. The light source generates measurement light. The at least one optical element projects the measurement light, as projection light, generated by the light source, and receives reflected light. The reflective member is disposed on the transport device. The reflective member reflects the projection light toward the placement table, and reflects the reflected light of the projection light, which is projected toward the placement table, toward the optical element. The drive unit operates the transport device such that a plurality of linear scanning ranges from the focus ring to the object placed on the placement table are scanned to the reflective member. The controller calculates a positional relationship between the focus ring and the object placed on the placement table based on the reflected light within the plurality of scanning ranges.

The aforementioned processing apparatus exhibits the same effect as the aforementioned position detecting system.

As described above, according to various aspects and exemplary embodiments of the present disclosure, there are provided a position detecting system and a processing apparatus which are capable of detecting a positional relationship between a focus ring and an object.

Hereinafter, various exemplary embodiments will be described in detail with reference to the drawings. Further, in the respective drawings, like reference numerals denote like parts or corresponding parts.

FIG. 1 is a view illustrating an example of a processing system. A processing system 1 illustrated in FIG. 1 includes a processing apparatus configured to process an object, a transport device configured to transport the object to the processing apparatus, and a position detecting system capable of detecting a positional relationship between the object and a part of the processing apparatus. The object is a disk-shaped object, for example, a wafer, which is to be processed by the processing apparatus. The object may have an inclined peripheral edge portion (bevel). The wafer may be or may not be subjected in advance to a processing treatment or plasma processing.

The processing system 1 includes tables 2a to 2d, containers 4a to 4d, a loader module LM, load lock chambers LL1 and LL2, process modules PM1 to PM6, and a transfer chamber TC.

The tables 2a to 2d are arranged along one edge of the loader module LM. The containers 4a to 4d are mounted on the table 2a to 2d, respectively. Each of the containers 4a to 4d is configured to accommodate a wafer W.

The loader module LM has a chamber wall which defines therein a transport space remaining at atmospheric pressure. The loader module LM has a transport device TU1 in the transport space. The transport device TU1 is configured to transport a wafer W between the containers 4a to 4d and the load lock chambers LL1 and LL2.

Each of the load lock chamber LL1 and the load lock chamber LL2 is provided between the loader module LM and the transfer chamber TC. Each of the load lock chamber LL1 and the load lock chamber LL2 provides a pre-decompression chamber.

The transfer chamber TC is connected to the load lock chamber LL1 and the load lock chamber LL2 through gate valves. The transfer chamber TC provides a decompression chamber of which the pressure may be reduced, and a transport device TU2 is accommodated in the decompression chamber. The transport device TU2 is configured to transport the wafer W between the load lock chambers LL1 and LL2 and the process modules PM1 to PM6 and between any two process modules among the process modules PM1 to PM6.

The process modules PM1 to PM6 are connected to the transfer chamber TC through gate valves. Each of the process modules PM1 to PM6 is a processing apparatus configured to perform dedicated processing such as plasma processing on the wafer W.

A series of operations of processing a wafer W in the processing system 1 will be described below as an example. The transport device TU1 of the loader module LM extracts a wafer W from any one of the containers 4a to 4d and transports the wafer W to one load lock chamber of the load lock chamber LL1 and the load lock chamber LL2. Next, the one load lock chamber reduces the pressure in the pre-decompression chamber to a predetermined pressure. Next, the transport device TU2 of the transfer chamber TC extracts the wafer W from the one load lock chamber and transports the wafer W to any one of the process modules PM1 to PM6. Further, one or more of the process modules PM1 to PM6 process the wafer W. Further, the transport device TU2 transports a processed wafer to one load lock chamber of the load lock chamber LL1 and the load lock chamber LL2 from the process module. Next, the transport device TU1 transports the wafer W to any one of the containers 4a to 4d from the one load lock chamber.

The processing system 1 further includes a control device MC. The control device MC may be a computer provided with a processor, a storage device such as a memory, a display device, an input-output device, a communication device, and the like. The aforementioned series of operations of the processing system 1 are implemented as the control device MC controls the respective parts of the processing system 1 in accordance with a program stored in the storage device.

Figure 2:
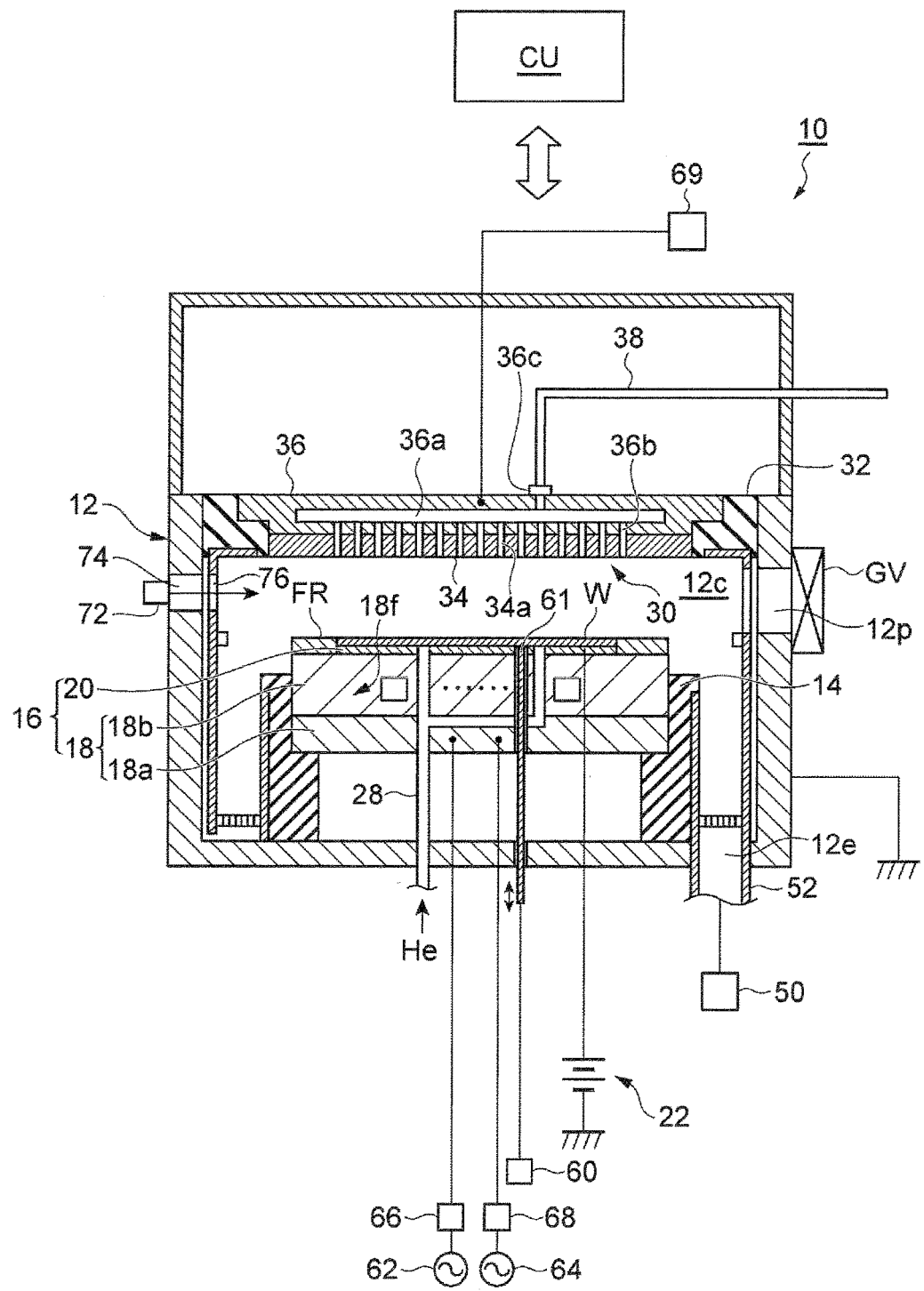
FIG. 2 is a vertical sectional view illustrating the configuration of a processing apparatus according to an exemplary embodiment.

Next, a processing apparatus 10, which is an example of the process modules PM1 to PM6, will be described. FIG. 2 is a vertical sectional view schematically illustrating a configuration of the processing apparatus 10 according to the exemplary embodiment. As illustrated in FIG. 2, the processing apparatus 10 includes a chamber main body 12 configured to accommodate a wafer W and process the wafer W using plasma. The chamber main body 12 provides an internal space as a chamber 12c. The chamber main body 12 is grounded. The chamber 12c is configured to be capable of being evacuated.

A support unit 14 is provided on a bottom portion of the chamber main body 12 in the chamber 12c. The support unit 14 is made of an insulating material. The support unit 14 has a substantially cylindrical shape. The support unit 14 extends upward from the bottom portion of the chamber main body 12 in the chamber 12c. An upper portion of the support unit 14 supports a placement table 16.

The placement table 16 includes a lower electrode 18 and an electrostatic chuck mechanism 20. The lower electrode 18 includes a first member 18a and a second member 18b. The first member 18a and the second member 18b are made of an electrically conductive material and has a roughly disk shape. The second member 18b is provided on the first member 18a and electrically connected to the first member 18a. The electrostatic chuck mechanism 20 is provided on the lower electrode 18.

The electrostatic chuck mechanism 20 is configured to hold the wafer W placed on the electrostatic chuck mechanism 20. The electrostatic chuck mechanism 20 has a disk-shaped insulating layer, and a membrane electrode provided in the insulating layer. A direct current power source 22 is electrically connected to the electrode of the electrostatic chuck mechanism 20. The electrostatic chuck mechanism 20 holds the wafer W using electrostatic force generated by direct current voltage from the direct current power source 22.

A focus ring FR is disposed on a peripheral edge portion of the lower electrode 18 so as to surround an edge of the wafer W and a circumference of the electrostatic chuck mechanism 20. The focus ring FR is an annular member. The focus ring FR is provided to improve in-plane uniformity of the plasma processing on the wafer W. At the time of maintenance, the focus ring FR may be removed from the placement table 16 and replaced with a new focus ring FR.

A through hole, which extends upward from a lower side, is formed in the electrostatic chuck mechanism 20. The lift pin 61 is provided in the through hole so as to be movable up and down. The lift pin 61 is driven vertically by a lift driving mechanism 60. A tip of the lift pin 61 pushes the wafer W upward when the lift pin 61 is moved up such that the wafer W is moved up. The lift pin 61 is operated by the lift driving mechanism 60 to receive the wafer W from a transport hand, which constitutes a part of the transport device TU2, and then places the wafer W on the placement table 16, and the lift pin 61 lifts up the wafer W from the placement table 16 and then delivers the wafer W to the transport hand.

The processing apparatus 10 is provided with a gas supply line 28. The gas supply line 28 supplies a heat transfer gas, for example, He gas from a heat transfer gas supply mechanism to a portion between an upper surface of the electrostatic chuck mechanism 20 and a rear surface of the wafer W.

The processing apparatus 10 further includes a counter electrode 30 (an example of an upper electrode). The counter electrode 30 is disposed above the placement table 16 so as to face the placement table 16. The counter electrode 30 is configured as a so-called shower head, and the counter electrode 30 is configured to supply a predetermined processing gas in the form of a shower to the wafer W placed on the placement table 16. The counter electrode 30 is supported at an upper side of the chamber main body 12 through an insulating member 32. The counter electrode 30 may include a top plate 34 and a support body 36. The top plate 34 faces the chamber 12c. A plurality of gas discharge holes 34a are formed in the top plate 34.

The support body 36 is configured to detachably support the top plate 34, and the support body 36 is made of a conductor. A gas diffusion chamber 36a is provided in the support body 36. A plurality of holes 36b, which communicate with a plurality of gas discharge holes 34a, respectively, extend downward from the gas diffusion chamber 36a. In addition, a port 36c, which guides the processing gas to the gas diffusion chamber 36a, is formed in the support body 36, and a pipe 38 is connected to the port 36c.

The chamber main body 12 is provided with a gas discharge port 12e. A gas discharge device 50 is connected to the gas discharge port 12e through a gas discharge pipe 52. The gas discharge device 50 has a vacuum pump. The gas discharge device 50 may reduce pressure in the chamber 12c. In addition, an opening 12p, which is configured to load or unload the wafer W, is provided in a sidewall of the chamber main body 12. The opening 12p is openable and closable by a gate valve GV.

A through hole 74 and a window 76 are formed in the sidewall of the chamber main body 12 at a position opposite to the opening 12p. The through hole 74 is a through hole that allows an interior and an exterior of the chamber 12c to communicate with each other. The window 76 is formed to correspond to the through hole 74 and may transmit light, and the window 76 is sealed in a gastight manner. The through hole 74 and the window 76 constitute a light introduction path for allowing projection light to enter the chamber 12c.

At least one collimator 72 (an example of an optical element), which is a constituent element of a position detecting system 100 to be described below, is disposed at a lateral side outside the chamber main body 12. The collimator 72 is connected to a light source through an optical fiber and projects measurement light by the light source, as projection light, into the chamber 12c through the through hole 74 and the window 76.

The processing apparatus 10 further includes a first high-frequency power source 62 and a second high-frequency power source 64. The first high-frequency power source 62 is a power source that generates first high-frequency waves for generating plasma. The first high-frequency wave has a frequency of 27 to 100 MHz, for example, a frequency of 40 MHz. The first high-frequency power source 62 is connected to the lower electrode 18 via a matching device 66. The matching device 66 has a circuit for matching output impedance of the first high-frequency power source 62 and a load side (lower electrode 18 side) input impedance. Further, the first high-frequency power source 62 may be connected to the counter electrode 30 via the matching device 66.

The second high-frequency power source 64 is a power source that generates second high-frequency waves for drawing ions into the wafer W. The second high-frequency wave has a frequency ranging from 400 kHz to 13.56 MHz, for example, a frequency of 3 MHz. The second high-frequency power source 64 is connected to the lower electrode 18 via a matching device 68. The matching device 68 has a circuit for matching output impedance of the second high-frequency power source 64 and the load side (lower electrode 18 side) input impedance.

The processing apparatus 10 may further include a direct current power source unit 69. The direct current power source unit 69 is connected to the counter electrode 30. The direct current power source unit 69 may generate negative direct current voltage and apply the direct current voltage to the counter electrode 30.

The processing apparatus 10 may further include a controller CU. The controller CU is a computer provided with a processor, a storage unit, an input device, a display device, and the like. The controller CU controls the respective parts of the processing apparatus 10. In the controller CU, an operator may perform an operation of inputting a command to manage the processing apparatus 10, by using the input device. In addition, the display device may display an operational situation of the processing apparatus 10. Further, the storage unit of the controller CU stores a control program and recipe data which allow the processor to control various types of processing to be performed in the processing apparatus 10. For example, the storage unit of the controller CU stores a control program and recipe data for performing a method MT in the processing apparatus 10.

Figure 3:
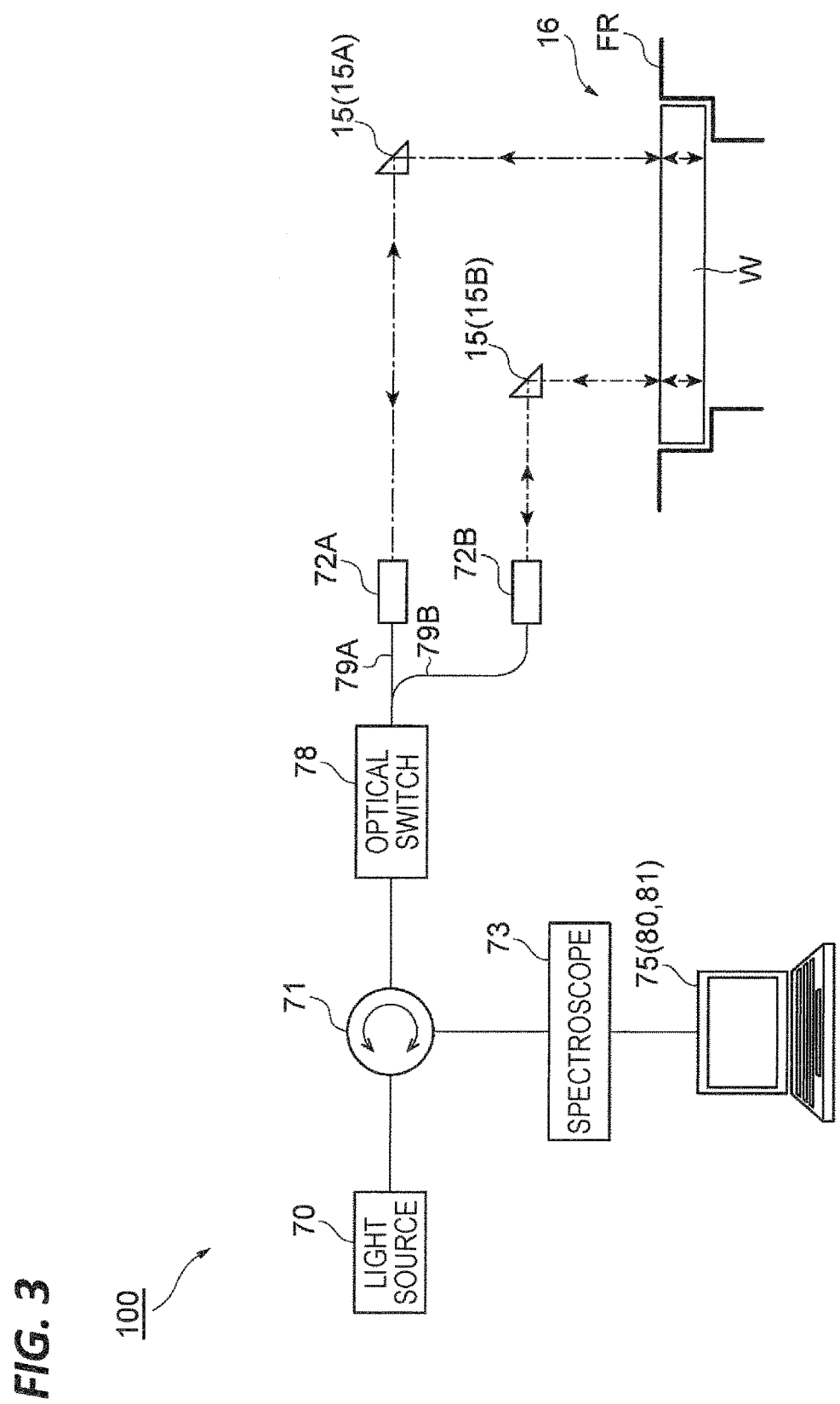
FIG. 3 is an explanatory view illustrating an example of a position detecting system according to an exemplary embodiment.

Next, a configuration of the position detecting system provided in the processing apparatus 10 will be described. FIG. 3 is a configuration diagram illustrating an example of the position detecting system according to the exemplary embodiment. The position detecting system 100 is a system which detects a positional relationship between the part of the processing apparatus 10 and the wafer W by measuring a distance from the collimator to a reflection point through prisms by using interference between reflected lights, and by scanning the prisms.

As illustrated in FIG. 3, the position detecting system 100 includes a light source 70, an optical circulator 71, an optical switch 78, a first collimator 72A (an example of an optical element), a second collimator 72B (an example of an optical element), a first prism 15A (an example of a reflective member), a second prism 15B (an example of a reflective member), and a spectroscope 73. The spectroscope 73 is connected to an arithmetic operation device 75 (an example of a drive unit and a controller). The arithmetic operation device 75 may be a computer provided with a processor, a storage device such as a memory, a display device, an input-output device, a communication device, and the like. A series of operations of the position detecting system 100, which will be described below, are implemented as the arithmetic operation device 75 controls the respective units of the position detecting system 100 in accordance with a program stored in the storage device. The arithmetic operation device 75 serves as a drive unit 80 and a controller 81 to be described below. The arithmetic operation device 75 may be integrated with the control device MC illustrated in FIG. 1 or the controller CU illustrated in FIG. 2. Further, the light source 70, the optical circulator 71, the optical switch 78, the first collimator 72A, the second collimator 72B, and the spectroscope 73 are connected to one another by using optical fibers, respectively.

The light source 70 generates measurement light having a wavelength that penetrates a measurement target. For example, a super luminescent diode (SLD) is used as the light source 70. For example, the measurement target has a plate shape, and has a front surface and a rear surface opposite to the front surface. For example, silicon (Si), quartz ($SiO_2$), sapphire ($Al_2O_3$), or the like is used for an object (wafer W) or the parts of the processing apparatus 10 such as the focus ring FR, the electrostatic chuck mechanism, or the like, which serve as the measurement target. For example, a refractive index of Si is 3.4 when a wavelength is 4 μm. For example, a refractive index of $SiO_2$ is 1.5 when a wavelength is 1 μm. For example, a refractive index of $Al_2O_3$ is 1.8 when a wavelength is 1 μm. These refractive indexes are changed by doping Si, $SiO_2$, and $Al_2O_3$ with impurities. For example, a refractive index of Si doped with impurities is about 3.6 when a wavelength is 1,560 nm.

The optical circulator 71 is connected to the light source 70, the optical switch 78, and the spectroscope 73. The optical circulator 71 projects the measurement light generated by the light source 70 to the optical switch 78. The optical switch 78 is provided with one input terminal, and for example, two output terminals. The input terminal is connected to the optical circulator 71. In addition, the two output terminals are connected to the first collimator 72A through a first optical fiber 79A and to the second collimator 72B through an optical fiber 79B, respectively. The optical switch 78 is configured to switch an output destination. The optical switch 78 inputs the light from the optical circulator 71 to the input terminal, and alternately outputs the light to the two output terminals.

The first collimator 72A and the second collimator 72B project the measurement light, as projection light, generated by the light source 70, and receive reflected light. Specifically, the first collimator 72A projects the measurement light, as the projection light, toward the first prism 15A in a horizontal direction, and receives reflected light from the first prism 15A. The second collimator 72B projects the measurement light, as the projection light, toward the second prism 15B in the horizontal direction, and receives reflected light from the second prism 15B.

The prism 15 (the first prism 15A or the second prism 15B) reflects the projection light toward the placement table 16, and reflects the reflected light of the projection light, which is projected toward the placement table 16, toward the first collimator 72A and the second collimator 72B. Specifically, the first prism 15A reflects the projection light toward the wafer W, thereby changing the projection light, which is a horizontal ray, into a vertical ray to the wafer W. The projection light is projected onto the surface of the wafer W. The reflected light from the wafer W returns back to the first prism 15A and is projected to the first collimator 72A. Similarly, the second prism 15B reflects the projection light toward the wafer W, thereby changing the projection light into a vertical ray to the wafer W. The projection light is projected onto the surface of the wafer W. The reflected light from the wafer W returns back to the second prism 15B and is projected to the second collimator 72B. The reflected light includes light reflected from the front surface and light reflected from the rear surface. Each of the first collimator 72A and the second collimator 72B projects the reflected light to the optical switch 78.

Figure 4:
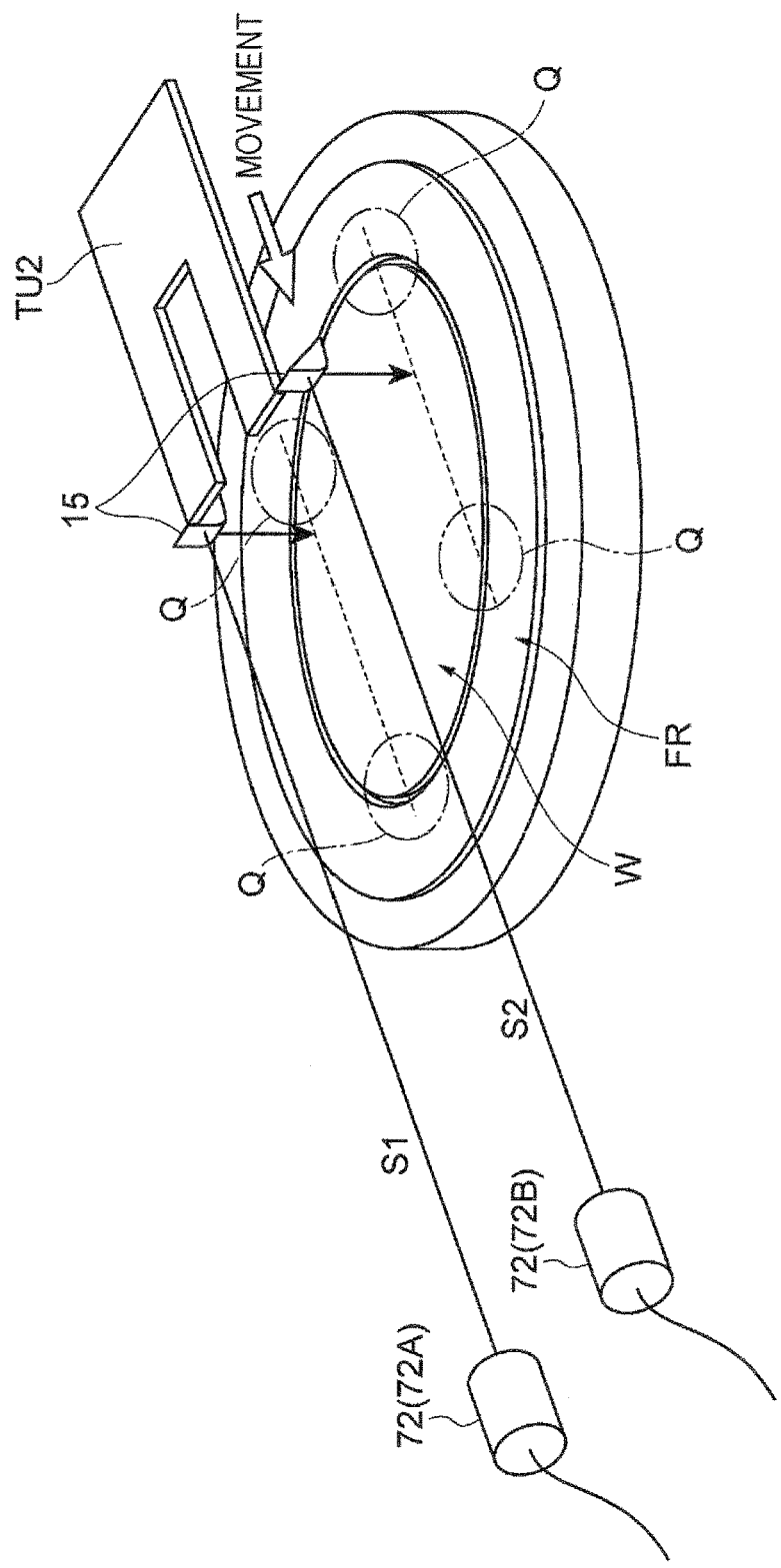
FIG. 4 is a view schematically illustrating an example of scanning using two prisms.

The prisms 15 are moved in the horizontal direction by the drive unit 80 and the transport device TU2. The prisms 15 are disposed on the transport device TU2. FIG. 4 is a view schematically illustrating an example of scanning using the two prisms. As illustrated in FIG. 4, the prisms 15 are provided on a hand of the transport device TU2. As an example, the prisms 15 are provided at lower and lateral sides of a hand tip.

The drive unit 80 of the arithmetic operation device 75 operates the transport device TU2. Specifically, the drive unit 80 moves the hand of the transport device TU2 linearly in the horizontal direction. Therefore, the drive unit 80 may scan the prisms 15 linearly in the horizontal direction. That is, the drive unit 80 operates the transport device TU2 to scan the prisms 15 within a plurality of scanning ranges having a predetermined linear shape. The scanning range is a linear range from the focus ring FR to the wafer W. For example, the drive unit 80 may scan the first prism 15A within two scanning ranges, or may scan the first prism 15A and the second prism 15B within a single scanning range. In an example illustrated in FIG. 4, the two prisms 15 scan four linear scanning ranges Q. Further, a scanning direction may be an outward radial direction or an inward radial direction.

Referring back to FIG. 3, each of the first collimator 72A and the second collimator 72B projects the reflected light to the optical switch 78. The optical switch 78 alternately projects the reflected light obtained by the first collimator 72A and the reflected light obtained by the second collimator 72B to the optical circulator 71. The optical circulator 71 projects the reflected light to the spectroscope 73. The spectroscope 73 measures a spectrum (interference intensity distribution) of the reflected light obtained from the optical circulator 71. The spectrum of the reflected light indicates an intensity distribution that depends on a wavelength or a frequency of the reflected light. The spectroscope 73 outputs the spectrum of the reflected light to the arithmetic operation device 75.

Figure 5:
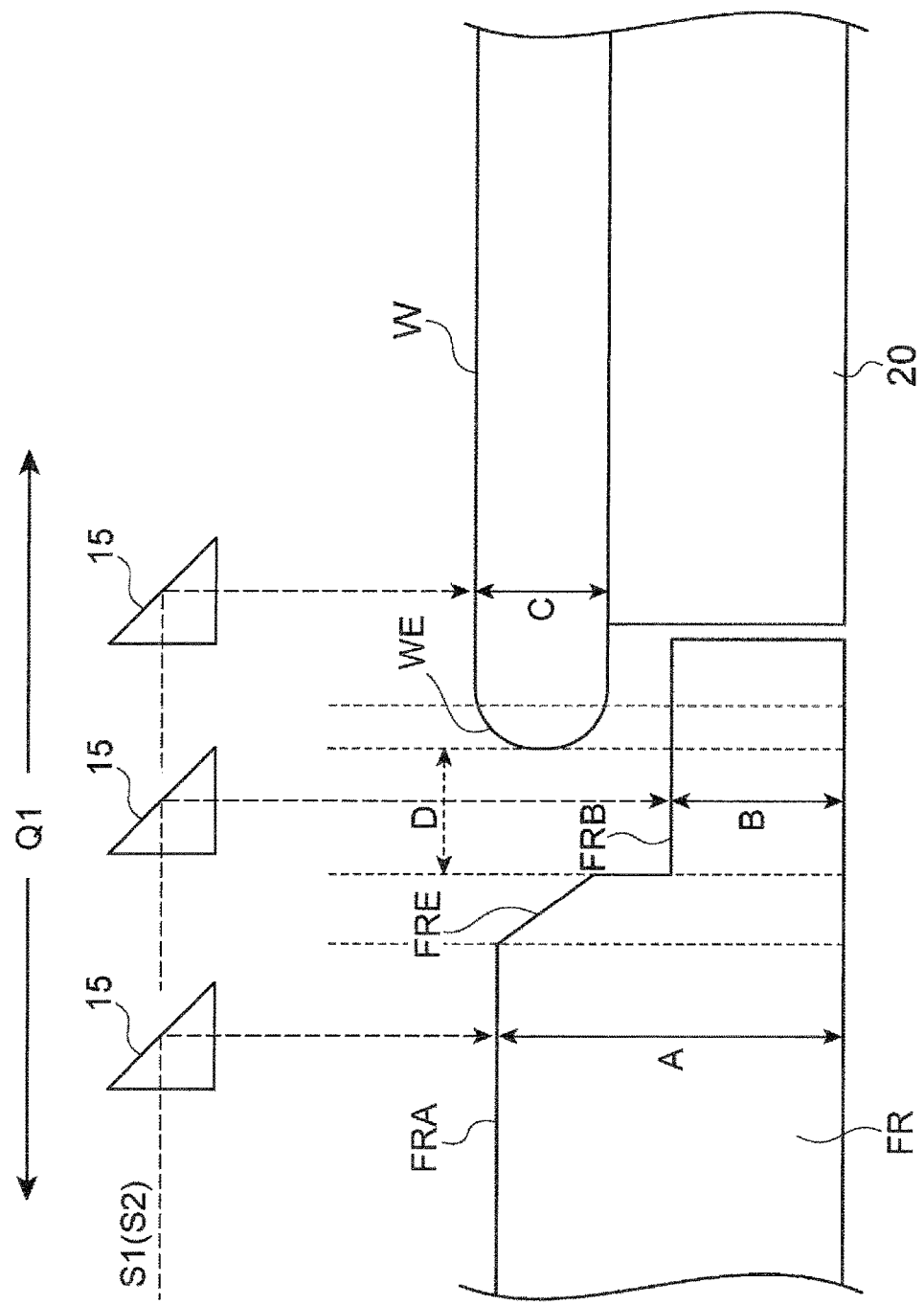
FIG. 5 is an enlarged explanatory view of a scanning range in FIG. 4.

The controller 81 of the arithmetic operation device 75 calculates a positional relationship between the focus ring FR and the wafer W placed on the placement table 16, for each scanning range, based on the reflected light within the scanning range. FIG. 5 is a view for explaining measurement points of the position detecting system 100 according to the exemplary embodiment. As illustrated in FIG. 5, a first scanning range Q1 will be described as an example. The prism 15 is moved within the first scanning range Q1, which is a range from the focus ring FR to the wafer W, while reflecting the projection light projected from the collimator 72 to the placement table.

The measurement light reflected by the prism 15 is reflected by the respective parts of the processing apparatus 10 or the wafer W. For example, the projection light is reflected by the front surface and the rear surface of the wafer W and the front surface and the rear surface of the focus ring FR. The position detecting system 100 may obtain an interference spectrum, which is obtained by interference between the respective reflected lights, for each scanning position.

Figure 6:
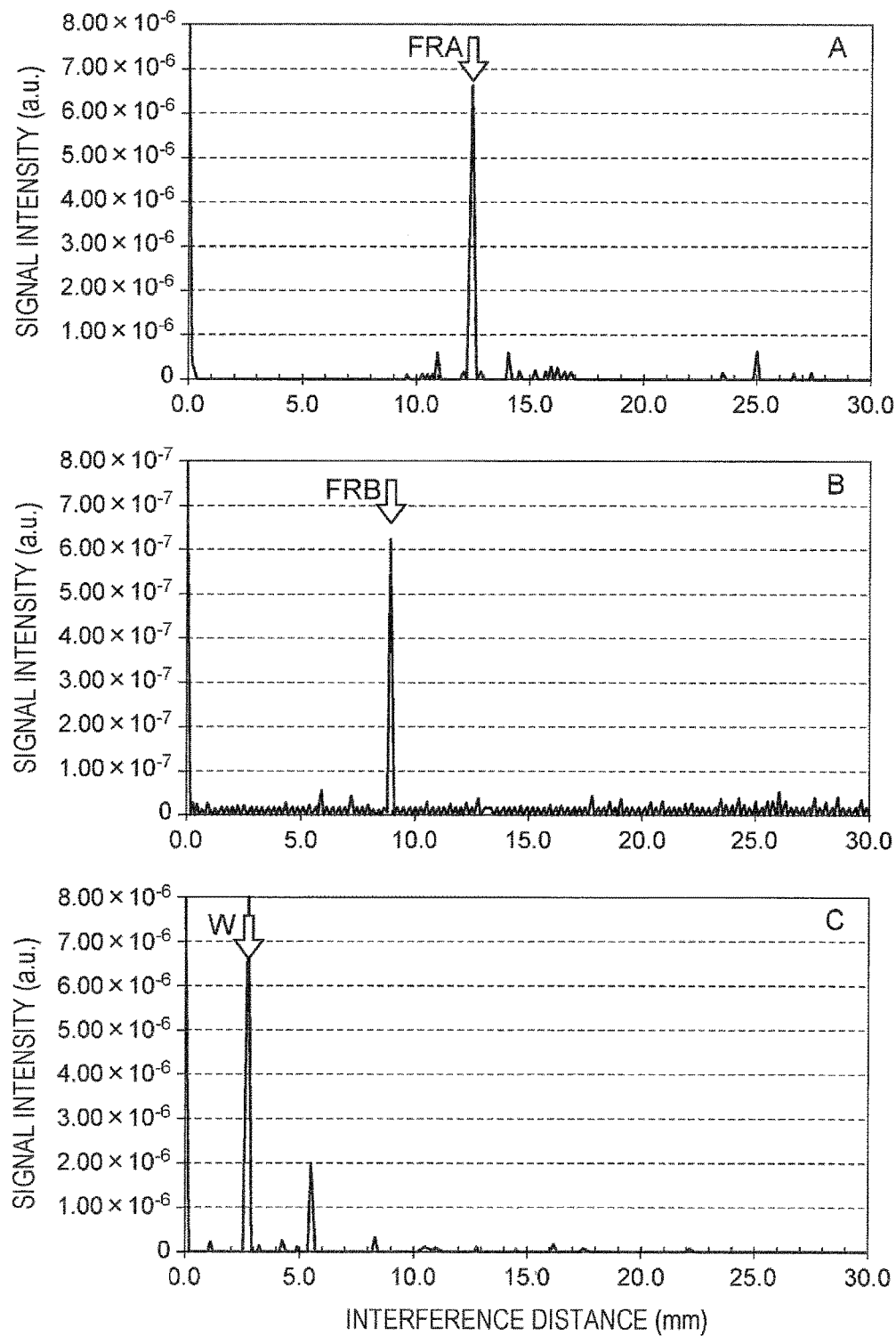
FIG. 6 is a view illustrating examples of interference spectra corresponding to the scanning ranges in FIG. 5.

FIG. 6 illustrates examples of interference spectra corresponding to scanning positions A, B, and C in FIG. 5. The interference spectra illustrated in FIG. 6 are obtained by emitting the measurement light of which the wavelength is 1560±20 nm and the spot diameter is 0.1 mm, from the collimator 72. In FIG. 6, a horizontal axis indicates an interference distance (mm), and a vertical axis indicates signal intensity (a.u.). In addition, a material of the focus ring FR and the wafer W is silicon doped with impurities. A peak corresponding to the scanning position A is a peak that appears by interference between lights reflected by front and rear surfaces of an upper stepped portion FRA of two stepped portions of the focus ring FR. A peak corresponding to the scanning position B is a peak that appears by interference between lights reflected by front and rear surfaces of a lower stepped portion FRB of the two stepped portions of the focus ring FR. A peak corresponding to the scanning position C is a peak that appears by interference between lights reflected by front and rear surfaces of the wafer W.

The controller 81 of the arithmetic operation device 75 calculates a thickness or a distance in a light traveling direction based on an interference distance at which the peak appears and based on a refractive index of the material of the measurement target such as the focus ring FR and the wafer W. The interference distance is expressed as the product of the refractive index and an actual thickness or an actual distance. For example, the controller 81 of the arithmetic operation device 75 calculates a thickness of the upper stepped portion FRA of the focus ring FR, which is 3.48 mm, by dividing an interference distance (12.53 mm) of the upper stepped portion FRA of the focus ring FR by a refractive index (3.6) of silicon doped with impurities which is the material of the focus ring FR. The controller 81 of the arithmetic operation device 75 calculates a thickness of the lower stepped portion FRB of the focus ring FR, which is 2.48 mm, by dividing an interference distance (8.94 mm) of the lower stepped portion FRB of the focus ring FR by a refractive index (3.6) of silicon doped with impurities which is the material of the focus ring FR. The arithmetic operation device 75 calculates a thickness of the wafer W, which is 0.77 mm, by dividing an interference distance (2.77 mm) of the wafer W by a refractive index (3.6) of silicon doped with impurities which is the material of the wafer W.

The controller 81 of the arithmetic operation device 75 performs the aforementioned calculation at each scanning position based on the interference spectrum obtained for each scanning position within the first scanning range Q1. The arithmetic operation device 75 plots, in the scanning direction, information about the thickness and the distance calculated within the first scanning range Q1 such that the arithmetic operation device 75 may also calculate displacements of the thickness and the distance in the horizontal direction. In addition, the arithmetic operation device 75 may calculate the positional relationship between the focus ring FR and the wafer W. For example, the positional relationship refers to a horizontal distance D between the focus ring FR and the wafer W, displacement magnitudes of centers of the focus ring FR and the wafer W, a difference in surface height, or the like.

Figure 7:
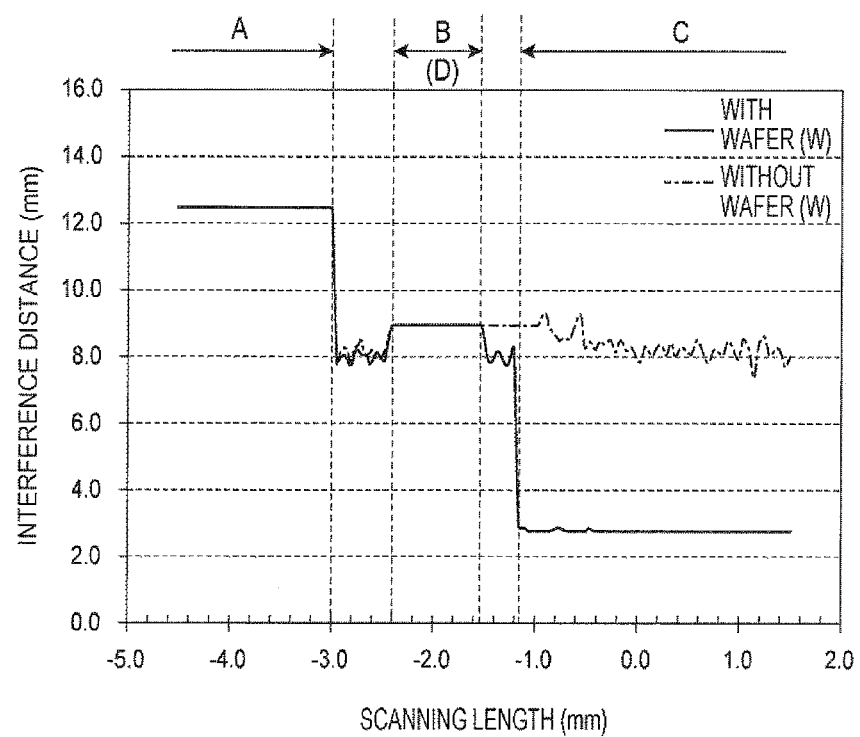
FIG. 7 is a view illustrating information about a height in a scanning region calculated based on the interference spectrum in FIG. 6.

FIG. 7 illustrates information about a height in a scanning region calculated based on the interference spectrum in FIG. 6. In FIG. 7, a horizontal axis indicates a scanning length (mm), and a vertical axis indicates an interference distance (mm). A height calculated by the arithmetic operation device 75 in a state in which the wafer W is placed on the placement table 16 is indicated by a solid line, and a height calculated by the arithmetic operation device 75 in a state in which the wafer W is not placed on the placement table 16 is indicated by an alternate long and short dashes line. As illustrated in FIG. 7, noise occurs at an inclined surface (inclined surface FRE in FIG. 5) of the focus ring FR and a peripheral edge portion (the peripheral edge portion WE in FIG. 5) of the wafer W, but a surface height of a flat portion of the wafer W and surface heights of flat portions (the upper stepped portion FRA and the lower stepped portion FRB in FIG. 5) of the focus ring FR are accurately calculated.

The controller 81 of the arithmetic operation device 75 may extract, among items of information about the heights in the scanning regions, information about the height of the flat portion of the wafer W and information about the heights of the flat portions (the upper stepped portion FRA and the lower stepped portion FRB in FIG. 5) of the focus ring FR, and may perform linear interpolation. As described above, the controller 81 of the arithmetic operation device 75 calculates the positional relationship between the focus ring FR and the wafer W by calculating the height information from which the noise is removed.

FIG. 8 is a table illustrating an example of part thicknesses and a scanning distance (the horizontal distance D between the focus ring FR and the wafer W) for each scanning position, that is, the positional relationship between the focus ring FR and the wafer W based on the result illustrated in FIG. 7. FIG. 8 also includes a comparison between a measured value obtained based on the height information illustrated in FIG. 7 and an assumed value (a part dimension of a new product). As illustrated in the table in FIG. 8, the horizontal distance D between the focus ring FR and the wafer W and a degree of consumption (a thickness direction) of the focus ring FR are ascertained. In addition, the controller 81 of the arithmetic operation device 75 may determine whether or not the wafer W is disposed at a target position on the placement table 16 based on the positional relationship calculated for each scanning range. For example, the target position of the wafer W is a center position of the placement table 16. The arithmetic operation device 75 may determine whether the wafer W is disposed at the target position on the placement table 16 by determining whether or not the center position of the wafer W and the center position of the focus ring FR coincide with each other.

An example of an arithmetic processing method for the determination will be described with reference to the example illustrated in FIG. 4. The controller 81 of the arithmetic operation device 75 measures the horizontal distance D between the focus ring FR and the wafer W with respect to at least two points in a circumferential direction. Based on the positional relationship between the two scanning ranges and the measured values, the controller 81 of the arithmetic operation device 75 calculates a displacement magnitude between the center position of the focus ring FR and the center position of the wafer W (a distance between the centers and a displacement direction). Because the positional relationship between the focus ring FR and the placement table 16 is fixed, the controller 81 of the arithmetic operation device 75 may calculate the displacement magnitude between the center position of the placement table 16 and the center position of the wafer W based on the displacement magnitude between the center position of the focus ring FR and the center position of the wafer W and the positional relationship between the focus ring FR and the placement table 16. For example, in a case in which the center position of the focus ring FR and the center position of the placement table 16 coincide with each other, the displacement magnitude between the center position of the focus ring FR and the center position of the wafer W becomes as it is the displacement magnitude between the center position of the placement table 16 and the center position of the wafer W. The controller 81 of the arithmetic operation device 75 determines whether or not the center position of the wafer W and the center position of the placement table 16 coincide with each other based on the calculated displacement magnitude.

Figure 9:
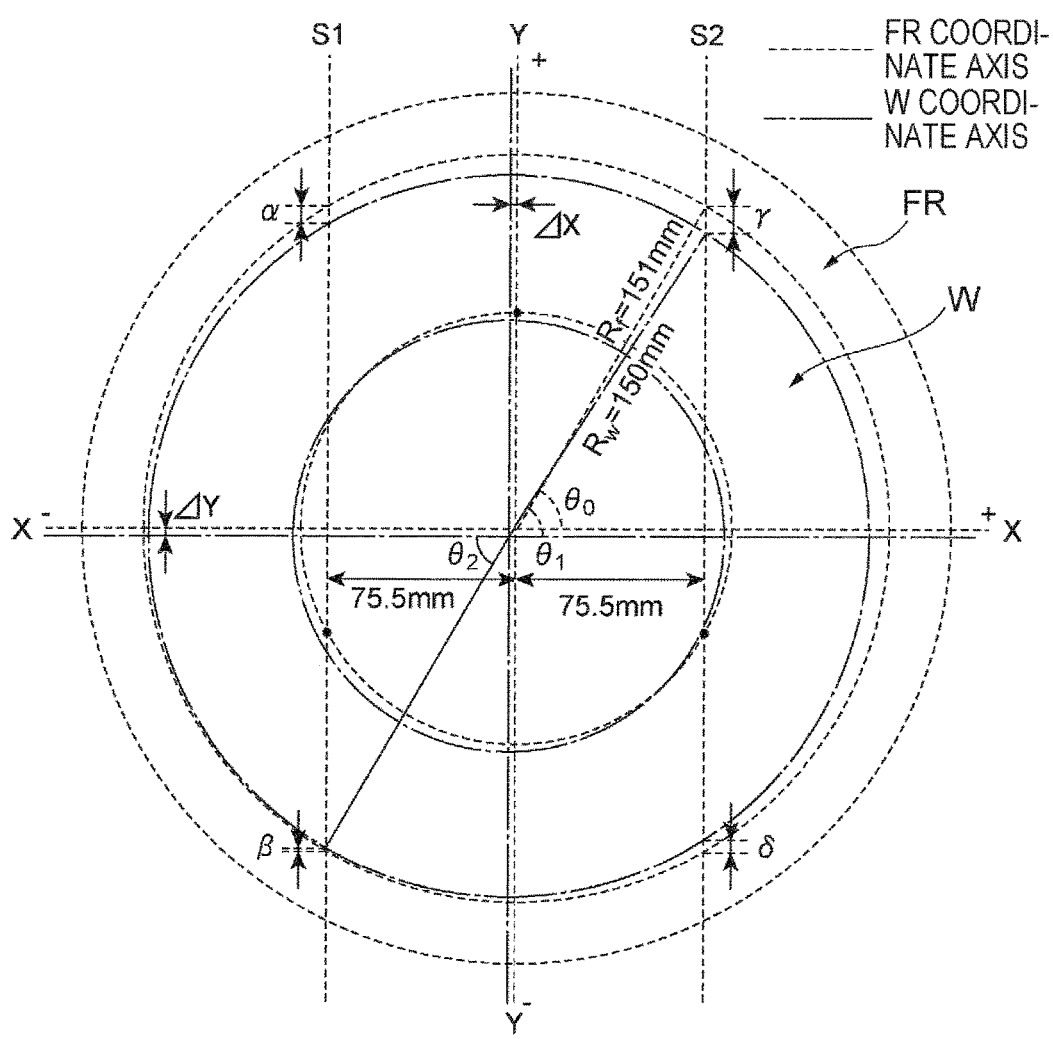
FIG. 9 is a view for explaining an example of a method of calculating the positional relationship between the focus ring and the wafer.

FIG. 9 is a view for explaining an example of a method of calculating the positional relationship between the focus ring FR and the wafer W. The two prisms 15 disposed on the hand of the transport device TU2 perform the scanning in parallel with a diameter of the focus ring FR. Scanning lines of the prisms 15 are indicated by S1 and S2. In addition, in FIG. 9, there are two scanning ranges on the scanning line S1 and two scanning ranges on the scanning line S2. That is, two scanning ranges of the scanning ranges are positioned on straight lines parallel to each other. The controller 81 calculates the displacement magnitude between the center position of the focus ring FR and the center position of the wafer W based on the positional relationship in the two scanning ranges among the four scanning ranges and the measured value. For example, the controller 81 selects the two scanning ranges present on a roughly diagonal line at an upper-right side and a lower-left side in the drawing. The controller 81 calculates displacement magnitudes $\Delta X$ and $\Delta Y$ between an origin of an FR coordinate axis of the focus ring FR and an origin of a W coordinate axis of the wafer by using a distance $\beta$ and a distance $\gamma$ between the focus ring FR and the wafer W which are measured within the scanning ranges.

As a premise of the calculation, it is assumed that a radius $R_f$ of the focus ring FR, a radius $R_W$ of the wafer W, and separation distances of the scanning lines S1 and S2 of the prisms 15 from the center of the focus ring FR are known in advance. As an example, it is assumed that the radius $R_f$ of the focus ring FR is 151 mm, the radius $R_W$ of the wafer W is 150 mm, and the scanning lines S1 and S2 of the prisms 15 extend to positions spaced apart from the center of the focus ring FR leftward and rightward by a distance of 75.5 mm.

The FR coordinate axis of the focus ring FR is indicated by a broken line, and the W coordinate axis of the wafer is indicated by an alternate long and short dashes line. Assuming that an angle between +X of the FR coordinate axis and a line, which connects an upper edge of the upper-right scanning range (scanning range that defines the distance γ) with the origin of the FR coordinate axis, is $\theta_0$, $\theta_0$ is 60°. In addition, it is assumed that an angle between +X of the W coordinate axis and a line, which connects a lower edge of the upper-right scanning range (scanning range that defines the distance γ) with the origin of the W coordinate axis, is $\theta_1$. In addition, it is assumed that an angle between −X of the W coordinate axis and a line, which connects an upper edge of the lower-left scanning range (scanning range that defines the distance β) with the origin of the W coordinate axis, is $\theta_2$. In this case, the following relational expression may be obtained.

$$\gamma = R_f \sin\theta_0 - (R_w \sin\theta_1 + \Delta Y)$$

$$\beta = R_f \sin\theta_0 - (R_w \sin\theta_2 - \Delta Y)$$

$$R_w \cos\theta_1 = 75.5 - \Delta X$$

$$R_w \cos\theta_2 = 75.5 + \Delta X \quad \text{[Equation 1]}$$

The following relational expression may be obtained based on the aforementioned relational expression.

$$\Delta Y = R_f \sin\theta_0 - R_w \sin\theta_1 - \gamma = -R_f \sin\theta_0 + R_w \sin\theta_2 + \beta \quad \text{[Equation 2]}$$

$$\Delta X = 75.5 - R_w \cos\theta_1 = -75.5 + R_w \cos\theta_2 \quad \text{[Equation 3]}$$

It is possible to calculate the displacement magnitudes ΔX and ΔY between the origin of the FR coordinate axis of the focus ring FR and the origin of the W coordinate axis of the wafer by combining the two relational expressions.

Figure 10:
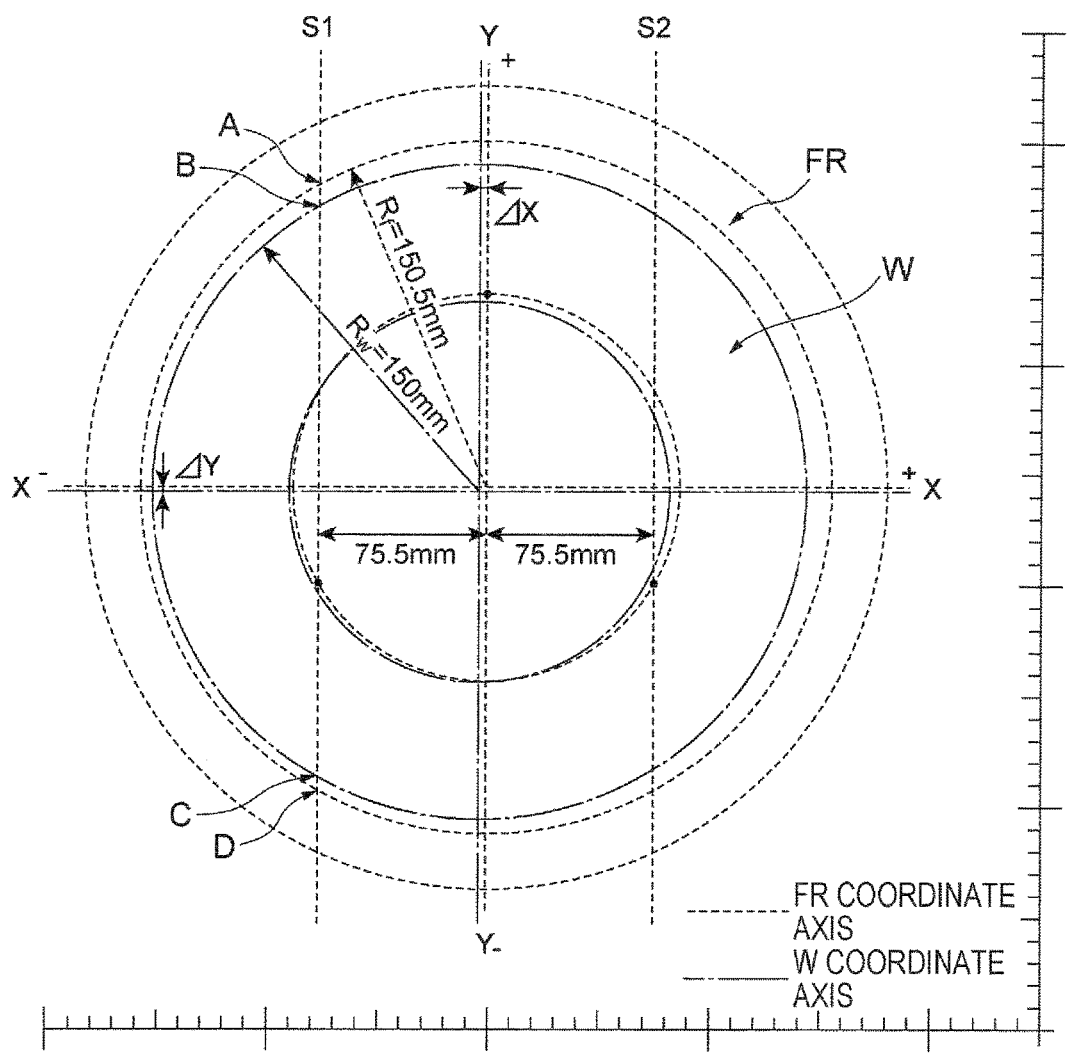
FIG. 10 is a view for explaining an example of a method of calculating the positional relationship between the focus ring and the wafer.

FIG. 10 is a view for explaining another example of the method of calculating the positional relationship between the focus ring FR and the wafer W. In this example, the displacement magnitude between the center position of the focus ring FR and the center position of the wafer W is calculated based on the positional relationship within the two scanning ranges, which is positioned on the single scanning line S1, and the measured value. Points at which the scanning line S1 intersects the focus ring FR and the wafer W are indicated by A, B, C, and D sequentially downward from above. A coordinate axis is set by determining a predetermined point at the lower-right side in FIG. 10 as an origin. Moreover, it is assumed that coordinates of the point A are $(x_{f1}, y_{f1})$, coordinates of the point B are $(x_{w1}, y_{w1})$, coordinates of the point C are $(x_{w2}, y_{w2})$, coordinates of the point D are $(x_{f2}, y_{f2})$, coordinates of a center position $S_f$ of the focus ring FR are $(x_{f0}, y_{f0})$, and coordinates of a center position $S_W$ of the wafer are $(x_{W0}, y_{W0})$. It is assumed that an inner diameter of the focus ring FR is 301 mm. It is assumed that a length from the center position $S_f$ of the focus ring FR to a line segment AD is $X_f$, and a half of the length of the line segment AD is $Y_f$. In this way, the following relational expression may be obtained.

$$Y_f = \frac{|y_{f1} - y_{f2}|}{2} \quad \text{[Equation 4]}$$

$$R_f = 150.5 \text{ mm}$$

$$X_f = \sqrt{R_f^2 - Y_f^2}$$

-continued $$S_f: (x_{f0}, y_{f0}) \begin{cases} x_{f0} = x_{f1} + X_f \\ y_{f0} = y_{f1} - Y_f \end{cases}$$

The coordinates $(x_{f0}, y_{f0})$ of the center position $S_f$ of the focus ring FR and the coordinates $(x_{W0}, y_{W0})$ of the center position $S_W$ of the wafer may be obtained from the aforementioned relational expression. Next, the following relational expression may be obtained from the obtained coordinates of the center position $S_f$ and the center position $S_W$.

$$\Delta X = x_{w0} - x_{f0} \quad \text{[Equation 5]}$$

$$\Delta Y = y_{w0} - y_{f0} \quad \text{[Equation 6]}$$

It is possible to calculate the displacement magnitudes ΔX and ΔY between the origin of the FR coordinate axis of the focus ring FR and the origin of the W coordinate axis of the wafer from the aforementioned relational expressions.

When the displacement magnitude of the center position is detected, the arithmetic operation device 75 may output the displacement magnitude of the center position to the control device MC. In this case, the control device MC may adjust a teaching value of the transport device TU2 (a control parameter for controlling an operation of the transport device TU2) so that the displacement magnitude of the center position becomes 0.

Figure 11:
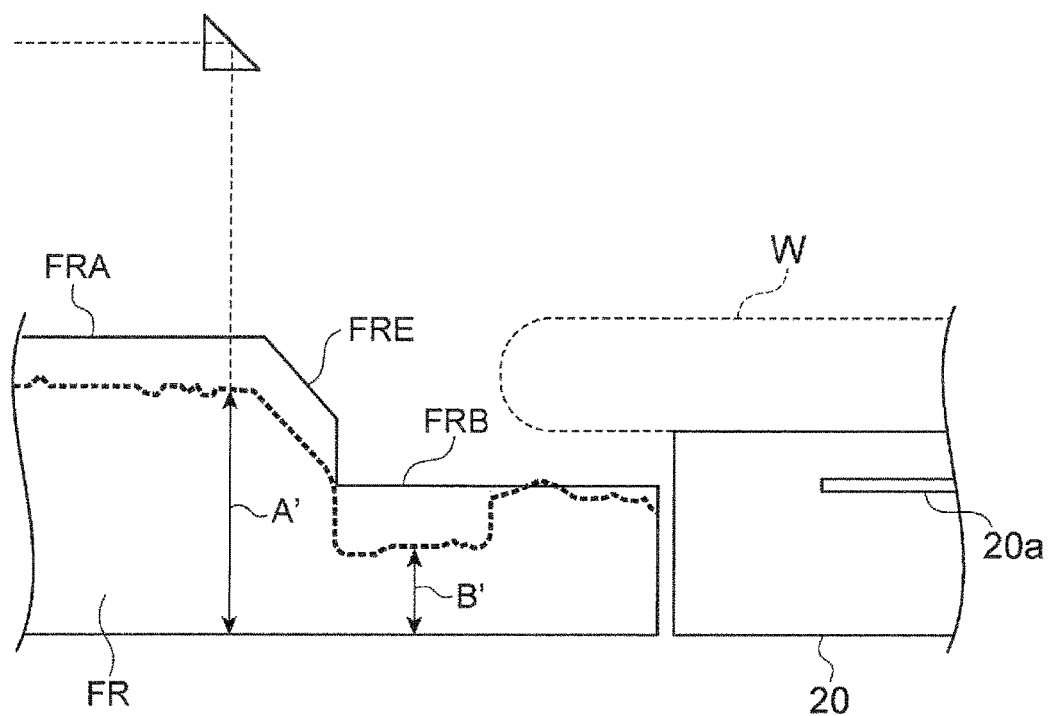
FIG. 11 is a view for explaining detection of consumption of a part of the processing apparatus according to the exemplary embodiment.

The arithmetic operation device 75 may detect consumption of the part of the processing apparatus 10. The part of the processing apparatus 10 is not limited as long as the part of the processing apparatus 10 is included within the scanning range, and the part of the processing apparatus 10 is, for example, the focus ring FR, the electrostatic chuck mechanism 20, or the like. FIG. 11 is a view for explaining detection of consumption of the part of the processing apparatus 10. In FIG. 11, an object to be subjected to the consumption detection is an upper surface of the focus ring FR. The upper surface of the focus ring FR is exposed to plasma and consumed in accordance with usage. The consumed focus ring FR is replaced with a new focus ring FR at the time of maintenance. In FIG. 11, the upper surface of the new focus ring FR immediately after maintenance is indicated by a solid line, and the upper surface of the focus ring FR, which has been used a predetermined number of times, is indicated by a broken line.

The arithmetic operation device 75 calculates a horizontal displacement of a height of the part within the scanning range. When the focus ring FR is replaced at the time of maintenance, the arithmetic operation device 75 calculates the horizontal displacement of the surface of the focus ring FR after the replacement prior to initiating the plasma processing, and stores the horizontal displacement as reference height information in the storage unit. The arithmetic operation device 75 calculates the horizontal displacement of the height of the surface of the focus ring FR after the wafer W is processed a predetermined number of times. Further, the arithmetic operation device 75 compares the calculated horizontal displacement (height information) of the height of the surface of the focus ring FR with the reference height information stored in the storage unit. Specifically, the arithmetic operation device 75 calculates a difference between the calculated height information and the reference height information.

The arithmetic operation device 75 may detect consumption of another part by using the same processing method of detecting the consumption of the focus ring FR. For example, to detect consumption of the electrostatic chuck mechanism 20, the arithmetic operation device 75 sets a scanning range so that the electrostatic chuck mechanism 20 is included within the scanning range, and the arithmetic operation device 75 may obtain in advance a reference height position of the electrostatic chuck mechanism 20. Further, since the electrostatic chuck mechanism 20 has therein an electrode 20a, it is possible to calculate the amount of consumption of the insulating layer from the upper surface of the electrostatic chuck mechanism 20 to the electrode 20a.

As described above, according to the processing apparatus 10 (position detecting system 100) according to the exemplary embodiment, it is possible to detect the amount of change in thicknesses of the focus ring FR and the wafer W within the two or more scanning ranges by scanning the prism(s) 15 (15A and/or 15B) (an example of a reflective member). Based on the amount of change in thicknesses, the distance D between the focus ring FR and the wafer W within the scanning range Q or the like is calculated. As described above, the position detecting system 100 may ascertain the positional relationship between the focus ring FR and the wafer W placed on the placement table 16 by scanning the prisms 15.

The processing apparatus 10 (position detecting system 100) according to the exemplary embodiment may calculate the positional relationship between the focus ring FR and the disk-shaped wafer W with respect to at least two points, thereby calculating the positional relationship between the wafer W and the placement table 16 and determining whether or not the wafer W is disposed at the target position on the placement table 16.

The processing apparatus 10 (position detecting system 100) according to the exemplary embodiment may adjust reflection of the prisms 15 corresponding to each of the collimators 72.

The processing apparatus 10 (position detecting system 100) according to the exemplary embodiment may perform measurement even though it is difficult to change a configuration of the counter electrode 30.

The processing apparatus 10 (position detecting system 100) according to the exemplary embodiment may detect the positional relationship between the wafer W and the part of the processing apparatus 10 such as the placement table 16 or the focus ring FR based on a geometrical relationship between the two scanning ranges.

The processing apparatus 10 (position detecting system 100) according to the exemplary embodiment may ascertain the amount of consumption of the part of the processing apparatus 10 such as the focus ring FR and the electrostatic chuck mechanism 20 by calculating a difference between reference height information obtained in advance.

The aforementioned exemplary embodiment may be carried out in various forms by being variously changed and modified based on knowledge of those skilled in the art. For example, the optical element is not limited to the collimator. The optical element is not particularly limited as long as the optical element is an element that serves to obtain reflected light from an object, and the optical element may be a focuser or the like. The reflective member is not limited to the prism and may be a mirror or the like. In addition, the light source 70 may be a wavelength variable light source of which the wavelength is controlled by the arithmetic operation device 75, and the spectroscope 73 may be a light receiving element that obtains spectra of lights reflected by front and rear surfaces of a measurement target.

The number of prisms 15 may be at least one. For example, even in the case of the two scanning ranges positioned on the diagonal line described with reference to FIG. 9, it is possible to scan the two scanning ranges positioned on the diagonal line by using the single prism 15 by moving the transport device TU2 leftward and rightward.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A position detecting system which is used in a processing apparatus having a placement table on which a disk-shaped object is placed and a focus ring which is disposed to surround a circumference of the object, the position detecting system comprising:
 a transport device configured to transports the object and place the object on the placement table;
 a light source configured to generate measurement light;
 at least one optical element configured to project the measurement light, as projection light, generated by the light source and to receive reflected light;
 a reflective member disposed on the transport device, and configured to reflect the projection light toward the placement table and reflect the reflected light of the projection light, which is projected toward the placement table, toward the optical element;
 a drive unit configured to operate the transport device such that the reflective member scans a plurality of linear scanning ranges from the focus ring to the object placed on the placement table; and
 a controller configured to calculate a positional relationship between the focus ring and the object placed on the placement table based on the reflected light within the plurality of linear scanning ranges.

2. The position detecting system according to claim 1, wherein the controller is configured to determine whether or not the object is disposed at a target position on the placement table based on the positional relationship calculated for each of the scanning ranges.

3. The position detecting system according to claim 1, wherein the transport device is configured to dispose the reflective member to correspond to the optical element.

4. The position detecting system according to claim 1, wherein the processing apparatus has a chamber main body in which the placement table and the focus ring are disposed, and an upper electrode which is disposed above the focus ring, and the light source and the at least one optical element are disposed at a lateral side outside the chamber main body.

5. The position detecting system according to claim 1, wherein among the plurality of linear scanning ranges, two scanning ranges are positioned on straight lines which are parallel to each other.

6. The position detecting system according to claim 1, wherein among the plurality of linear scanning ranges, two scanning ranges are positioned on a single straight line.

7. The position detecting system according to claim 1, wherein the controller calculates, for each of the scanning ranges, a difference between height information of the focus ring obtained based on the reflected light and reference height information of the focus ring obtained in advance.

8. A processing apparatus for processing a disk-shaped object, the processing apparatus comprising:
- a placement table configured to place the object thereon;
- a focus ring disposed to surround a circumference of the object; and
- a position detecting system,
- wherein the position detecting system includes:
- a transport device configured to transport the object and place the object on the placement table;
- a light source configured to generate measurement light;
- at least one optical element configured to projects the measurement light, as projection light, generated by the light source and receives reflected light;
- a reflective member disposed on the transport device, and configured to reflect the projection light toward the placement table and reflect the reflected light of the projection light, which is projected toward the placement table, toward the optical element;
- a drive unit configured to move the transport device such that a plurality of linear scanning ranges from the focus ring to the object placed on the placement table are scanned to the reflective member; and
- a controller configured to calculate a positional relationship between the focus ring and the object placed on the placement table based on the reflected light within the plurality of linear scanning ranges.

* * * * *